(12) United States Patent
Farnworth et al.

(10) Patent No.: US 6,909,929 B2
(45) Date of Patent: Jun. 21, 2005

(54) STEREOLITHOGRAPHIC METHOD AND APPARATUS FOR PACKAGING ELECTRONIC COMPONENTS

(75) Inventors: Warren M. Farnworth, Nampa, ID (US); Mark S. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 10/293,160

(22) Filed: Nov. 12, 2002

(65) Prior Publication Data

US 2003/0093173 A1 May 15, 2003

Related U.S. Application Data

(62) Division of application No. 09/259,142, filed on Feb. 26, 1999, now Pat. No. 6,549,821.

(51) Int. Cl.[7] .............................................. G06F 19/00
(52) U.S. Cl. ................... 700/120; 264/272.11; 438/106
(58) Field of Search ................................. 700/120, 116, 700/117, 118, 119, 121, 123, 98; 257/678, 684, 687, 690, 694, 700, 707, 705, 787; 29/825, 829, 831, 832, 841; 264/4.1–4.7, 163, 272.11, 272.14, 272.15, 272.17; 438/106, 110–112, 123–124

(56) References Cited

U.S. PATENT DOCUMENTS

| 4,577,056 A | 3/1986 | Butt ........................... 174/52.4 |
| 4,696,525 A | 9/1987 | Coller et al. .................. 439/69 |
| 5,028,983 A | 7/1991 | Bickford et al. ............ 257/668 |
| 5,173,220 A | 12/1992 | Reiff et al. .................. 264/401 |
| 5,264,061 A | 11/1993 | Juskey et al. ................ 156/214 |
| 5,278,442 A | 1/1994 | Prinz et al. .................. 257/417 |
| 5,433,260 A | 7/1995 | Taylor .......................... 164/97 |
| 5,484,314 A | 1/1996 | Farnworth .................... 445/24 |
| 5,641,996 A | 6/1997 | Omoya et al. ............... 257/707 |
| 5,675,122 A | 10/1997 | Taylor ..................... 174/50.58 |
| 5,705,117 A | 1/1998 | O'Connor et al. .......... 264/401 |
| 5,754,408 A | 5/1998 | Derouiche ................... 361/773 |
| 5,801,073 A | 9/1998 | Robbins et al. ............. 436/125 |
| 5,834,840 A | 11/1998 | Robbins et al. ............. 257/705 |
| 5,953,594 A | 9/1999 | Bhatt .......................... 438/125 |

(Continued)

OTHER PUBLICATIONS

Miller et al., "Maskless Mesoscale Materials Deposition", Deposition Technology, Sep. 2001, pp. 20–22.

Miller, "New Laser–Directed Deposition Technology", Microelectronic Fabrication, Aug. 2001, p. 16.

(Continued)

Primary Examiner—Leo Picard
Assistant Examiner—Chad Rapp
(74) Attorney, Agent, or Firm—TraskBritt

(57) ABSTRACT

A stereolithographic method and apparatus for applying packaging material to workpieces, such as preformed electronic components, including semiconductor dice, with a high degree of precision, and resulting articles. A machine vision system including at least one camera is operably associated with a computer controlling a stereolithographic system for application of material so that the system may recognize the position and orientation of workpieces, such as semiconductor dice, to which the material is to be applied. The requirement for precise mechanical workpiece alignment is eliminated, and the ability of the system to recognize size, configuration and topography of different workpieces affords greater manufacturing flexibility. The method includes stereolithographic application of material for packaging electronic components, and the electronic components so packaged are also part of the invention.

18 Claims, 6 Drawing Sheets

U.S. PATENT DOCUMENTS

| | | | |
|---|---|---|---|
| 6,048,744 | A | 4/2000 | Corisis et al. ............... 438/15 |
| 6,073,056 | A * | 6/2000 | Gawronski et al. ........... 700/98 |
| 6,251,488 | B1 | 6/2001 | Miller et al. |
| 6,259,962 | B1 | 7/2001 | Gothait |
| 6,268,584 | B1 | 7/2001 | Keicher et al. |
| 6,299,057 | B1 | 10/2001 | Ball ....................... 228/180.5 |
| 6,326,698 | B1 | 12/2001 | Akram |
| 6,337,122 | B1 | 1/2002 | Grigg et al. |
| 6,391,251 | B1 | 5/2002 | Keicher et al. |
| 6,432,752 | B1 | 8/2002 | Farnworth |
| 6,482,576 | B1 | 11/2002 | Farnworth et al. |
| 6,489,007 | B2 | 12/2002 | Grigg et al. |
| 6,514,798 | B2 | 2/2003 | Farnworth |
| 6,524,346 | B1 | 2/2003 | Farnworth |
| 6,544,465 | B1 | 4/2003 | Farnworth et al. |
| 6,544,821 | B2 | 4/2003 | Akram |
| 6,544,902 | B1 | 4/2003 | Farnworth |
| 6,562,278 | B1 | 5/2003 | Farnworth et al. |
| 6,585,927 | B2 | 7/2003 | Grigg et al. |
| 6,593,171 | B2 | 7/2003 | Farnworth |
| 6,607,689 | B1 | 8/2003 | Farnworth |
| 6,635,333 | B2 | 10/2003 | Grigg et al. |
| 2002/0066966 | A1 | 6/2002 | Farnworth |
| 2002/0098623 | A1 | 7/2002 | Akram |
| 2002/0171177 | A1 | 11/2002 | Kritchman et al. |
| 2002/0182782 | A1 | 12/2002 | Farnworth |
| 2002/0195748 | A1 | 12/2002 | Farnworth |
| 2003/0003179 | A1 | 1/2003 | Farnworth et al. |
| 2003/0003180 | A1 | 1/2003 | Farnworth et al. |
| 2003/0003380 | A1 | 1/2003 | Farnworth et al. |
| 2003/0003405 | A1 | 1/2003 | Farnworth et al. |
| 2003/0043360 | A1 | 3/2003 | Farnworth |
| 2003/0068584 | A1 | 4/2003 | Farnworth et al. |
| 2003/0072926 | A1 | 4/2003 | Grigg et al. |
| 2003/0077418 | A1 | 4/2003 | Grigg et al. |
| 2003/0089999 | A1 | 5/2003 | Akram |
| 2003/0092220 | A1 | 5/2003 | Akram |
| 2003/0102566 | A1 | 6/2003 | Farnworth |
| 2003/0129787 | A1 | 7/2003 | Farnworth |
| 2003/0151167 | A1 | 8/2003 | Kritchman et al. |
| 2003/0155693 | A1 | 8/2003 | Farnworth et al. |
| 2003/0201531 | A1 | 10/2003 | Farnworth et al. |
| 2003/0203158 | A1 | 10/2003 | Farnworth et al. |
| 2003/0205849 | A1 | 11/2003 | Farnworth |
| 2003/0207213 | A1 | 11/2003 | Farnworth |

OTHER PUBLICATIONS

Webpage, Objet Prototyping the Future, Objet FullCure700 Series, 1 page.

Webpage, Objet Prototyping the Future, How it Works, 2 pages.

U.S. Appl. No. 09/589,841, filed Jun. 8, 2000, entitled "Stereolithographic Methods for Forming a Protective Layer on a Semiconductor Device Substrate and Substrates Including Protective Layers So Formed", inventor Farnworth et al.

U.S. Appl. No. 09/651,930, filed Aug. 31, 2000, entitled "Semiconductor Device Including Leads in Communication with Contact Pads Thereof and a Stereolithographically Fabricated Package Substantially Encapsulating the Leads and Methods for Fabricating the Same", inventor Salman Akram.

U.S. Appl. No. 10/370,755, filed Feb. 20, 2003, entitled "Chip Scale Package Structures and Method of Forming Conductive Bumps Thereon", inventor Warren M. Farnworth.

U.S. Appl. No. 10/608,749, filed Jun. 26, 2003, entitled "Methods for Labeling Semiconductor Device Components", inventor Grigg et al.

U.S. Appl. No. 10/619,918, filed Jul. 15, 2003, entitled "Stereolithographic Methods for Fabricating Hermetic Semiconductor Device Packages and Semiconductor Devices Including Stereolithographically Fabricated Hermetic Packages", inventor Warren M. Farnworth.

U.S. Appl. No. 10/663,402, filed Sep. 16, 2003, entitled "Processes for Facilitating Removal of Stereolithographically Fabricated Objects From Platens of Stereolithographic Fabrication Equipment, Object Release Elements For Effecting Such Processes, Systems and Fabrication Processes Employing the Object Release Elements, and Objects Which Have Been Fabricated Using the Object Release Elements", inventor Farnworth et al.

U.S. Appl. No. 10/672,098, filed Sep. 26, 2003, entitled "Apparatus and Methods for Use in Stereolithographic Processing of Components and Assemblies", inventor Warren M. Farnworth.

U.S. Appl. No. 10/690,417, filed Oct. 20, 2003, entitled "Methods of Coating and Singulating Wafers and Chip–Scale Packages Formed Therefrom", inventor Farnworth et al.

* cited by examiner

STEREOLITHOGRAPHIC METHOD AND APPARATUS FOR PACKAGING ELECTRONIC COMPONENTS

CROSS-REFERENCE TO RELATED APPLICATION

This application is a divisional of application Ser. No. 09/259,142, filed Feb. 26, 1999, now U.S. Pat. No. 6,549,821.

BACKGROUND OF THE INVENTION

1. Field of the Invention

The present invention relates generally to stereolithography and, more specifically, to the use of stereolithography in the packaging of electronic components. Use of a machine vision system such as a pattern recognition system to facilitate application of stereolithographic techniques to fabrication of electronic components and other products is encompassed in the invention.

2. State of the Art

In the past decade, a manufacturing technique termed "stereolithography," also known as "layered manufacturing," has evolved to a degree where it is employed in many industries.

Essentially, stereolithography, as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semi-solid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated or fixed or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer which can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques.

However, to the inventors' knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. Furthermore, conventional stereolithography apparatus and methods fail to address the difficulties of precisely locating and orienting a number of pre-existing components for stereolithographic application of material thereto without the use of mechanical alignment techniques or to -otherwise assuring precise, repeatable placement of components.

In the electronics industry, state-of-the-art packaging of semiconductor dice is an extremely capital-intensive proposition. In many cases, semiconductor dice carried on, and electrically connected to, lead frames are individually packaged with a filled-polymer material in a transfer molding process. A transfer molding apparatus is extremely expensive, costing at least hundreds of thousands of dollars in addition to the multi-hundred thousand dollar cost of the actual transfer molding dies in which strips of lead frames bearing semiconductor dice are disposed for encapsulation.

So that the reader may more fully understand the present invention in the context of the prior art, it seems appropriate to provide a brief description of a transfer apparatus and method for forming a plastic package about an LOC die assembly. The term "transfer" molding is descriptive of this process as the molding compound, once melted, is transferred under pressure to a plurality of remotely-located mold cavities containing die assemblies to be encapsulated.

FIG. 9 is a flow chart of a typical process sequence for plastic package molding. It should be noted that the solder dip/plate operation has been shown as one step for brevity; normally, plating would occur prior to trim and form. FIGS. 10A and 10B show pre-molding and post-molding positions of encapsulant during a transfer molding operation using a typical mold apparatus comprising upper and lower mold halves 410 and 412, each mold half including a platen 414 or 416 with its associated chase 418 or 420. Heating elements 422 are employed in the platens to maintain an elevated and relatively uniform temperature in the runners and mold cavities during the molding operation. FIG. 11 shows a top view of one side of the transfer mold apparatus of FIGS. 10A and 10B.

In operation, a heated pellet of resin mold compound 430 is disposed beneath ram or plunger 432 in pot 434. The plunger descends, melting the pellet and forcing the melted encapsulant down through sprue 436 and into primary runner 438, from which it travels to transversely-oriented secondary runners 440 and across gates 442 into and through the mold cavities 444, wherein die assemblies 500 comprising dies 100 with attached lead frames 502 are disposed (usually in strips so that a strip of six lead frames, for example, would be cut and placed in and across the six cavities 444 shown in FIG. 11). Air in the runners 438 and 440 and mold cavities 444 is vented to the atmosphere through vents 446 and 448. At the end of the molding operation, the encapsulant is "packed" by application of a higher pressure to eliminate voids and reduce nonuniformities of the encapsulant in the mold cavities 444. After molding, the encapsulated die assemblies are ejected from the cavities 444 by ejector pins 450, after which they are post-cured at an elevated temperature to complete cross-linking of the resin mold compound 430, followed by other operations as known in the art and set forth in FIG. 1 by way of example. It will be appreciated that other transfer molding apparatus configurations, as well as variations in the details of the described method are known in the art. However, none of such are pertinent to the invention, and so will not be discussed herein.

Encapsulant flow in the mold cavities 444 is demonstrably non-uniform. The presence of the die assembly 500 comprising a die 100 with lead frame 502 disposed across the mid-section of a cavity 444 splits the viscous encapsulant flow front into upper and lower components. Further, the presence of the (relatively) large die 100 with its relatively lower temperature in the middle of a cavity 444 permits the flow front on each side of the die 100 to advance ahead of the front which passes over and under the die 100.

Encapsulant filler particles may become lodged between lead ends and the underlying die surfaces. The non-uniform flow characteristics of the viscous encapsulant flow may cause particles to be more forcefully driven between the lead ends and the die 100 and wedged or jammed in place in low-clearance areas. As the encapsulant flow front advances and the mold operation is completed by packing the cavities, pressure in substantially all portions of the mold cavities reaches hydrostatic. With LOC arrangements where lead ends extending over the active surface of a die 100 are bonded thereto by adhesive-coated tape or an adhesive material patterned on the active surface, the relative inflexibility of the tightly-constrained (adhered) lead ends maintains the point stresses of any particles trapped under the lead ends. These residual stresses are carried forward in the fabrication process to post-cure and beyond. When mechanical, thermal or electrical stresses attendant to post-encapsulation processing are added to the residual point stresses associated with the lodged filler particles, cracking or perforation of the die coat may occur, with the adverse effects previously noted. It has been observed that filler particle-induced damage occurs more frequently in close proximity to the adhesive, where lead flexure potential is at its minimum. In addition to damage by filler particles, transfer molding also results in the problem of bond wire sweep, wherein bond wires may be damaged, broken, loosened from their connections to bond pads or lead ends or swept into shorting contact with an adjacent bond wire under the impetus of the flow front of molten resin encapsulant as it flows through a mold cavity.

In addition to end-product deficiencies as noted above due to the phenomena of particulate die coat penetration and bond wire sweep, the capital-intensive nature of the transfer molding apparatus, including the requirement for different, multi-hundred thousand dollar molds for each die and lead frame arrangement as well as the high cost of the encapsulant resin and waste of same which is not used in the mold cavities, renders the transfer molding process an extremely expensive one. Mold damage and refurbishment is an additional, ongoing cost. Further, the elevated temperatures used in the molding process as well as in the post cure of the resin encapsulant is detrimental to the circuitry of the die as well as to the electrical connections to the lead ends.

BRIEF SUMMARY OF THE INVENTION

The present invention provides a method of applying material to a preformed structure such as an electronic component with a high degree of precision to create a package therefor. For example, a semiconductor die may be provided with a protective structure in the form of a layer of dielectric material having a controlled thickness or depth over or adjacent one or more surfaces thereof. As used herein, the term "package" as employed with reference to electrical components includes partial as well as full covering of a given semiconductor die surface with a dielectric material, and specifically includes a semiconductor die configured in a so-called "chip scale" package, wherein the package itself, including the die, is of substantially the same dimensions as, or only slightly larger than, the die itself.

The packaging method of the present invention may be applied, by way of example and not limitation, to a die mounted to a lead frame (having a die mounting paddle or in a paddle-less leads-over-chip (LOC) or in a leads-under-chip (LUC) configuration), mounted to a carrier substrate in a chip-on-board (COB) or board-on-chip (BOC) arrangement, or in other packaging designs, as desired.

The present invention employs computer-controlled, 3-D CAD initiated, stereolithographic techniques to form structures comprising one or more layers of material abutting a workpiece such as an electronic component and, more specifically, a semiconductor die. A dielectric layer, or layer segments, may be formed over or adjacent a single die or substantially simultaneously over or adjacent a large number of dice or die locations on a semiconductor wafer or other large-scale semiconductor substrate, individual dice or groups of dice then being singulated therefrom. As used herein, the term "semiconductor die" may be taken to encompass all of the aforementioned semiconductor substrate-based elements and the term "electronic component" may be taken in its broadest sense to encompass both active and passive components, combinations thereof and assemblies of components as well as individual components.

Precise mechanical alignment of workpieces, including singulated semiconductor dice or larger semiconductor substrates having multiple die locations, is not required to practice the method of the present invention, which includes the use of machine vision to locate workpieces, their orientation and features. Specifically, and in a preferred embodiment, semiconductor dice, dimensions thereof and features or other components thereon or associated therewith (such as lead frames, bond wires, solder bumps, etc.), or features on a larger semiconductor substrate, may be identified by a machine vision system for alignment and material disposition purposes by an associated stereolithographic apparatus.

In a preferred embodiment, packaging for electronic components according to the invention is fabricated using precisely focused electromagnetic radiation in the form of an ultraviolet (UV) wavelength laser under control of a computer and responsive to input from a machine vision system such as a pattern recognition system to fix or cure a liquid material in the form of a photopolymer.

It should be understood that the invention is not so limited to stereolithographic techniques employing a UV-curable photopolymer, but may be employed with other techniques employing alternative materials. Furthermore, the apparatus of the present invention, insofar as it employs a machine vision system, encompasses any and all stereolithographic apparatus and the application of any and all materials thereby, including both metallic and non-metallic materials applied in any state and cured or otherwise fixed to at least a semi-solid state to define a three-dimensional structure having identifiable boundaries.

DETAILED DESCRIPTION OF THE INVENTION

Figure 1:
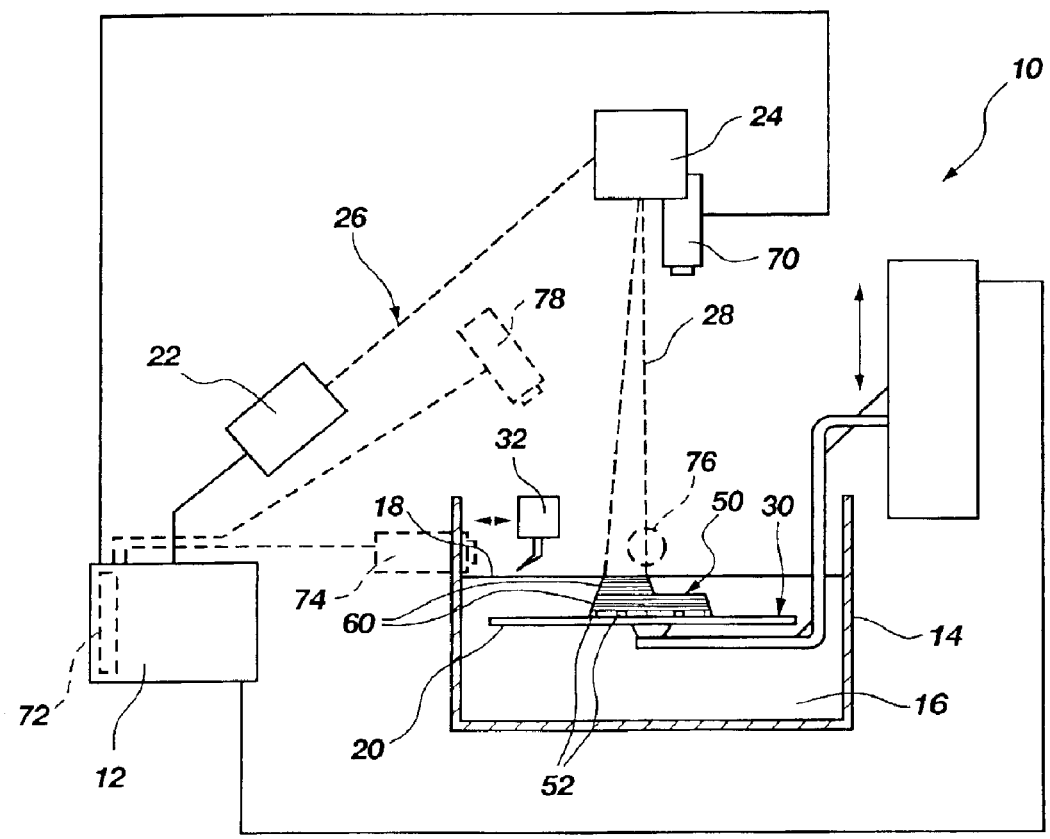
FIG. 1 is a schematic side elevation of an exemplary stereolithography apparatus suitable for use in practicing the method of the present invention.

FIG. 1 depicts schematically various components, and operation, of an exemplary stereolithography apparatus 10 to facilitate the reader's understanding of the technology employed in implementation of the present invention, although those of ordinary skill in the art will understand and appreciate that apparatus of other designs and manufacture may be employed in practicing the method of the present invention. The preferred, basic stereolithography apparatus for implementation of the present invention as well as operation of such apparatus are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836. The disclosure of each of the foregoing patents is hereby incorporated herein by this reference. As noted in more detail below, however, a significant modification is made to conventional stereolithographic apparatus, such as those offered by 3D Systems, Inc., in the context of initiation and control of the stereolithographic disposition and fixation of materials. Specifically, the apparatus of the present invention employs a so-called "machine vision" system, in combination with suitable programming of the computer controlling the stereolithographic process, to eliminate the need for accurate positioning or mechanical alignment of workpieces to which material is stereolithographically applied. Thus, the present invention expands the use of conventional stereolithographic apparatus and methods to application of materials to large numbers of workpieces which may differ in orientation, size, thickness, configuration and surface topography. While the workpieces employed in the practice of the preferred embodiment of the method of the invention may be, by way of example only, semiconductor dice, wafers, partial wafers, other substrates of semiconductor material or carrier substrates bearing integrated circuits on dice or other semiconductor structures, the method and apparatus of the invention are applicable to fabrication of other products wherein adaptability for rapidly fabricating large numbers of parts having the aforementioned variations in orientation, size, thickness and surface topography is desired.

With reference again to FIG. 1 and as noted above, a 3-D CAD drawing of an object to be fabricated in the form of a data file is placed in the memory of a computer 12 controlling the operation of apparatus 10 if computer 12 is not a CAD computer in which the original object design is effected. In other words, an object design may be effected in a first computer in an engineering or research facility and the data files transferred via wide or local area network, tape, disc, CD-ROM or otherwise as known in the art to computer 12 of apparatus 10 for object fabrication.

The data is preferably formatted in an STL (for StereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 10 also includes a reservoir 14 (which may comprise a removable reservoir interchangeable with others containing different materials) of liquid material 16 to be employed in fabricating the intended object. In the currently preferred embodiment, the liquid is a photo-curable polymer (hereinafter "photopolymer") responsive to light in the UV wavelength range. The surface level 18 of the liquid material 16 is automatically maintained at an extremely precise, constant magnitude by devices known in the art responsive to the output of sensors within the apparatus and preferably under control of computer 12. A support platform or elevator 20, precisely vertically movable in fine, repeatable increments responsive to control of computer 12, is located for movement downward into and upward out of liquid material 16 in reservoir 14. A UV wavelength range laser plus associated optics and galvanometers (collectively identified as 22) for controlling the scan of laser beam 26 in the X-Y plane across platform 20 has associated therewith mirror 24 to reflect beam 26 downwardly as beam 28 toward surface 30 of platform 20. Beam 28 is traversed in a selected pattern in the X-Y plane, that is to say, in a plane parallel to surface 30, by initiation of the galvanometers under control of computer 12 to at least partially cure, by impingement thereon, selected portions of liquid material 16 disposed over surface 30 to at least a semi-solid state. The use of mirror 24 lengthens the path of the laser beam, effectively doubling same, and provides a more vertical beam 28 than would be possible if the laser 22 itself were mounted directly above platform surface 30, thus enhancing resolution.

Data from the STL files resident in computer 12 is manipulated to build an object 50 one layer at a time. Accordingly, the data mathematically representing object 50 is divided into subsets, each subset representing a slice or layer of object 50. This is effected by mathematically sectioning the 3-D CAD model into a plurality of horizontal layers, a "stack" of such layers representing object 50. Each slice or layer may be from about 0.0001 to 0.0300 inch thick. As mentioned previously, a thinner slice promotes higher resolution by enabling better reproduction of fine vertical surface features of object 50. In some instances, a base support or supports 52 for an object 50 may also be programmed as a separate STL file, such supports 52 being fabricated before the overlying object 50 in the same manner, and facilitating fabrication of an object 50 with reference to a perfectly horizontal plane and removal of object 50 from surface 30 of elevator 20. Where a "recoater" blade 32 is employed as described below, the interposition of base supports 52 precludes inadvertent contact of blade 32 with surface 30.

Before fabrication of object 50 is initiated with apparatus 10, the primary STL file for object 50 and the file for base support(s) 52 are merged. It should be recognized that, while reference has been made to a single object 50, multiple objects may be concurrently fabricated on surface 30 of platform 20. In such an instance, the STL files for the various objects and supports, if any, are merged. Operational parameters for apparatus 10 are then set, for example, to adjust the size (diameter, if circular) of the laser light beam used to cure material 16.

Before initiation of a first layer for a support 52 or object 50 is commenced, computer 10 automatically checks and, if necessary, adjusts by means known in the art the surface level 18 of liquid material 16 in reservoir 14 to maintain same at an appropriate focal length for laser beam 28. U.S. Pat. No. 5,174,931, referenced above and previously incorporated herein by reference, discloses one suitable level control system. Alternatively, the height of mirror 24 may be adjusted responsive to a detected surface level 18 to cause the focal point of laser beam 28 to be located precisely at the surface of liquid material 16 at surface level 18 if level 18 is permitted to vary, although this approach is somewhat more complex. The platform 20 may then be submerged in liquid material 16 in reservoir 14 to a depth equal to the thickness of one layer or slice of the object 50, and the liquid surface level 18 readjusted as required to accommodate liquid material 16 displaced by submergence of platform 20. Laser 22 is then activated so that laser beam 28 will scan liquid material 16 over surface 30 of platform 20 to at least partially cure (e.g., at least partially polymerize) liquid material 16 at selective locations, defining the boundaries of a first layer 60 (of object 50 or support 52, as the case may be) and filling in solid portions thereof. Platform 20 is then lowered by a distance equal to the thickness of a layer 60, and the laser beam 28 scanned to define and fill in the second layer 60 while simultaneously bonding the second layer to the first. The process is then repeated, layer by layer, until object 50 is completed.

If a recoater blade 32 is employed, the process sequence is somewhat different. In this instance, the surface 30 of platform 20 is lowered into liquid material 16 below surface level 18, then raised thereabove until it is precisely one layer's thickness below blade 32. Blade 32 then sweeps horizontally over surface 30, or (to save time) at least over a portion thereof on which object 50 is to be fabricated, to remove excess liquid material 16 and leave a film thereof of the precise, desired thickness on surface 30. Platform 20 is then lowered so that the surface of the film and material level 18 are coplanar and the surface of the material 16 is still. Laser 22 is then initiated to scan with laser beam 28 and define the first layer 60. The process is repeated, layer by layer, to define each succeeding layer 60 and simultaneously bond same to the next lower layer 60 until object 50 is completed. A more detailed discussion of this sequence and apparatus for performing same is disclosed in U.S. Pat. No. 5,174,931, previously incorporated herein by reference.

As an alternative to the above approach to preparing a layer of liquid material 16 for scanning with laser beam 28, a layer of liquid material 16 may be formed on surface 30 by lowering platform 20 to flood material over surface 30 or over the highest completed layer 60 of object 50, then raising platform 20 and horizontally traversing a so-called "meniscus" blade across the platform (or just the formed portion of object 50) one layer thickness thereabove, followed by initiation of laser 22 and scanning of beam 28 to define the next higher layer 60.

Another alternative to layer preparation of liquid material 16 is to merely lower platform 20 to a depth equal to that of a layer of liquid material 16 to be scanned and then traverse a combination flood bar and meniscus bar assembly horizontally over platform 20 (or merely over object 50) to substantially concurrently flood liquid material 16 over platform 20 and define a precise layer thickness of liquid material 16 for scanning.

All of the foregoing approaches to liquid material flooding and layer definition and apparatus for initiation thereof are known in the art and are not material to practice of the present invention, so no further details relating thereto will be provided herein.

Each layer 60 of object 50 is preferably built by first defining any internal and external object boundaries of that layer with laser beam 28, then hatching solid areas of object 50 with laser beam 28. If a particular part of a particular layer 60 is to form a boundary of a void in the object above or below that layer 60, then the laser beam 28 is scanned in a series of closely-spaced, parallel vectors so as to develop a continuous surface, or skin, with improved strength and resolution. The time it takes to form each layer 60 depends upon its geometry, surface tension and viscosity of material 16, and thickness of the layer.

Once object 50 is completed, platform 20 is elevated above surface level 18 of liquid material 16, and the platform 20 with object 50 may be removed from apparatus 10. Excess, uncured liquid material 16 on the surface of object 50 may be manually removed, and object 50 then solvent-cleaned and removed from platform 20, usually by cutting it free of base supports 52. Object 50 may then require postcuring, as material 16 may be only partially polymerized and exhibit only a portion (typically 40% to 60%) of its fully cured strength. Postcuring to completely harden object 50 may be effected in another apparatus projecting UV radiation in a continuous manner over object 50 and/or by thermal completion of the initial, UV-initiated partial cure.

In practicing the present invention, a commercially available stereolithography apparatus operating generally in the manner as that described with respect to apparatus 10 of FIG. 1 is preferably employed. For example and not by way of limitation, the SLA-250/50HR, SLA-5000 and SLA-7000 stereolithography systems, each offered by 3D Systems, Inc. of Valencia, Calif., are suitable for practice of the present invention. Photopolymers believed to be suitable for use in practicing the present invention include Cibatool SL 5170 and SL 5210 resins for the SLA-250/50HR system, Cibatool SL 5530 resin for the SLA-5000 and Cibatool SL 7510 resin for the SLA-7000 system. All of these resins are available from Ciba Specialty Chemicals Corporation. By way of example and not limitation, the layer thickness of material 16 to be formed, for purposes of the invention, may be on the order of 0.001 to 0.020 inch, with a high degree of uniformity over a field on a surface 30 of a platform 20. It should be noted that different material layers may be of different heights, so as to form a structure of a precise, intended total height or to provide different material thicknesses for different portions of a structure. The size of the laser beam "spot" impinging on the surface of liquid material 16 to cure same may be on the order of 0.002 inch to 0.008 inch. Resolution is preferably ±0.0003 inch in the X-Y plane (parallel to surface 30) over at least a 0.5 inch×0.25 inch field from a center point, permitting a high resolution scan effectively across a 1.0 inch×0.5 inch area. Of course, it is desirable to have substantially this high a resolution across the entirety of surface 30 of platform 20 to be scanned by laser beam 28, which area may be termed the "field of exposure", such area being substantially coextensive with the vision field of a machine vision system employed in the apparatus of the invention as explained in more detail below. The longer and more effectively vertical the path of laser beam 26/28, the greater the achievable resolution.

Referring again to FIG. 1 of the drawings, it should be noted that apparatus 10 of the present invention includes a camera 70 which is in communication with computer 12 and preferably located, as shown, in close proximity to mirror 24 located above surface 30 of platform 20. Camera 70 may be any one of a number of commercially available cameras, such as capacitive-coupled discharge (CCD) cameras available from a number of vendors. Suitable circuitry as required for adapting the output of camera 70 for use by computer 12 may be incorporated in a board 72 installed in computer 12, which is programmed as known in the art to respond to images generated by camera 70 and processed by board 72. Camera 70 and board 72 may together comprise a so-called "machine vision system," and specifically a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Figure 2:
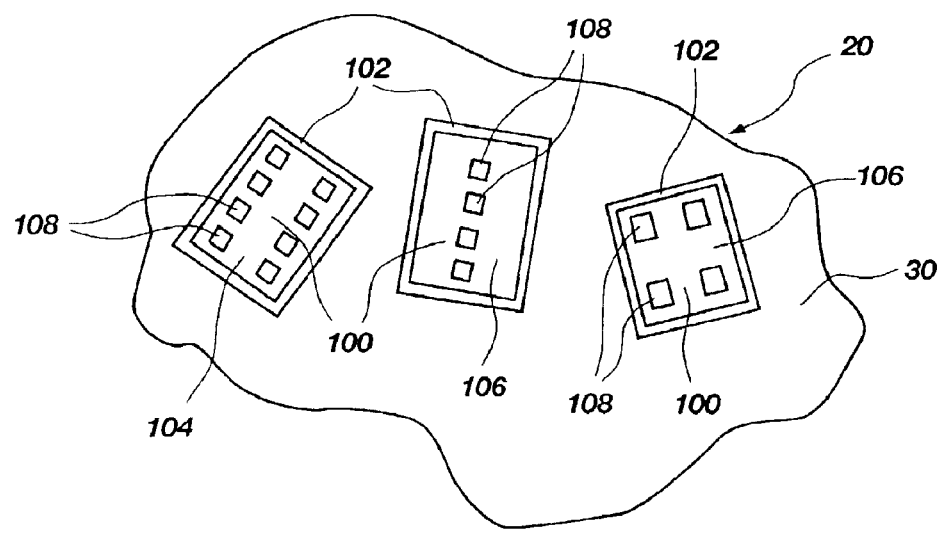
FIG. 2 is a schematic top elevation of a plurality of workpieces in the form of semiconductor dice disposed on a platform of the stereolithographic apparatus of FIG. 1.
Figure 3:
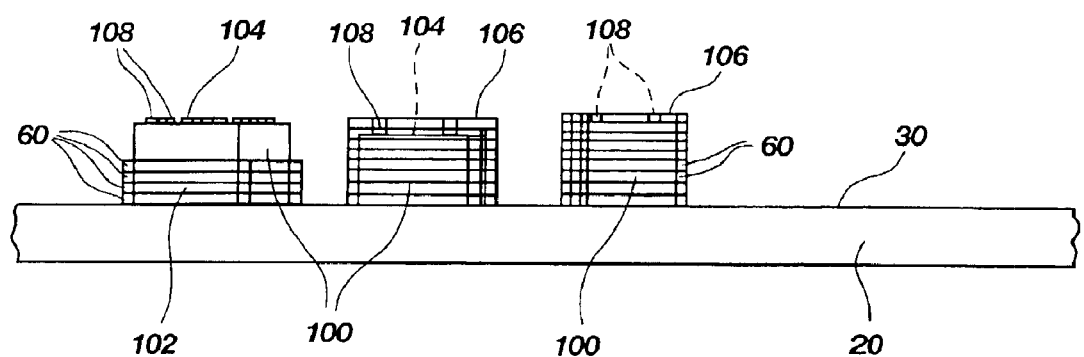
FIG. 3 is a schematic side elevation of a plurality of workpieces in the form of semiconductor dice disposed on a platform of the stereolithographic apparatus of FIG. 1 and depicting a stereolithographic sequence for packaging the dice according to the present invention.

In order to facilitate practice of the present invention with apparatus 10, a data file representative of at least one physical parameter, such as (for example) the size, configuration, thickness and surface topography of, for example, a particular type and design of semiconductor die 100 to be packaged, is placed in the memory of computer 12. If the die 100 is to be packaged with a lead frame, data representative of the die with attached and electrically connected lead frame is provided. If packaging material in the form of the aforementioned photopolymer is to be applied only to an upper surface of a die 100, or to the upper surface and portions or all of the side surfaces of a die 100, a large plurality of such dice 100 may be placed on surface 30 of platform 20 for packaging, as depicted in FIGS. 2 and 3. FIG. 3 depicts dice 100 in various stages of package formation to completion, the packaging being shown as substantially transparent as results if the aforementioned photopolymers are employed. If package sidewalls are to be formed, it is desirable that the surface 30 of platform 20 comprise, or be coated or covered with, a material from which the at least partially cured material 16 defining the lowermost layers of the package sidewalls may be easily released to prevent damage to the packaging. Alternatively, a solvent may be employed to release the package sidewalls from platform 20 after packaging is completed. Such release and solvent materials are known in the art. See, for example, U.S. Pat. No. 5,447,822 referenced above and previously incorporated herein by reference. Camera 70 is then activated to locate the position and orientation of each die 100 to be packaged by scanning platform 20 and comparing the features of the dice 100 with those in the data file residing in memory, the locational and orientational data for each die 100 then also being stored in memory. It should be noted that the data file representing the design size, shape and topography for the dice may be used at this juncture to detect physically defective or damaged dice 100 prior to packaging and to automatically delete such dice 100 from the packaging operation. It should also be noted that data files for more than one type (size, thickness, configuration, surface topography) of die 100 may be placed in computer memory and computer 12 programmed to recognize not only die locations and orientations, but which type of die 100 is at each location so that material 16 may be cured by laser beam 28 in the correct pattern and to the height required to define package sidewalls and to provide a package top at the correct level and of the correct size and shape over each die 100.

Continuing with reference to FIG. 3 of the drawings, dice 100 on platform 20 may then be submerged partially below the surface level 18 of liquid material 16 to a depth the same as, or greater than, the thickness of a first layer of material 16 to be at least partially cured to a semi-solid state to form the lowest layer 60 of a package sidewall 102 about each of dice 100, and then raised to a depth equal to the layer thickness if lowered to a greater depth than a layer thickness, the surface of liquid material 16 being allowed to settle. The material 16 selected for use in packaging dice 100 may be one of the above-referenced resins from Ciba Specialty Chemical Company which exhibits a desirable dielectric constant, is of sufficient (semiconductor grade) purity, and is of sufficiently similar coefficient of thermal expansion (CTE) to that of the die so that the package and the die itself are not unduly stressed during thermal cycling in testing and subsequent normal operation.

Laser 22 is then activated and scanned to direct beam 28, under control of computer 12, about the periphery of each die 100 to effect the aforementioned partial cure of material 16 to form a first layer 60. The platform 20 is then lowered into reservoir 14 and raised to another sidewall layer thickness-equaling depth increment and the laser 22 activated to add another sidewall layer 60. This sequence continues, layer 60 by layer 60, until the package sidewalls 102 are built up about dice 100. As noted below with regard to FIG. 12, the sidewalls 102 may comprise only a single layer 60 of material 16. At this point, platform 20 is again lowered to submerge the upwardly-facing active surfaces 104 of dice 100 below surface level 18 and then positioned a desired additional depth increment below the surface of material 16, which may be lesser or greater than the sidewall layer thickness, depending upon the thickness required for the top 106 of the package. For example, a greater thickness of material 16 may be required to cover a die 100 having wire bonds protruding upwardly therefrom than if a die 100 is covered before connection to a lead frame. It should also be noted that the thickness of material 16 over a selected portion of a given die 100 may be altered die by die, again responsive to output of camera 70 or one or more additional cameras 74, 76 or 78, shown in broken lines in FIG. 1, detecting the protrusion of unusually high wire bond loops or other features projecting above the active surface 104 of a given die 100 which should be, but is not, covered by the "design" or preprogrammed thickness of material 16 disposed over and at least partially cured on active surface 104. In any case, laser 22 is again activated to at least partially cure material 16 residing over each die 100 to form a package top 106 of one or more layers 60, top 106 being substantially contiguous with package sidewalls 102, laser beam 26 being controlled as desired to avoid certain surface features on dice 100, such as bond pads 108 intended to be exposed for connection to higher-level packaging as by wire bonding, TAB bonding using flex circuits, or use of projecting conductive connectors in a "flip chip" configuration. It should also be noted (see FIG. 4) that the package top may be formed within an outer boundary defined by sidewalls 102 extending above active surface 104 and forming a dam 102d thereabout. In this instance, the platform 20 may be submerged so that material 16 enters the area within the dam 102d, raised above surface level 18, and then laser beam 28 activated, and scanned to at least partially cure material 16 residing within the dam or, alternatively, to merely cure a "skin" 106a over the top of the dice 100 which may also bound bond pads 108, the final cure of the remaining, underlying material 106b of the package top 106 being effected subsequently by broad-source UV radiation in a chamber, by thermal cure in an oven. In this manner, an extremely thick protective package top of material 16 may be formed in minimal time within apparatus 10.

Referring to FIGS. 4, 5, 6A and 6B of the drawings by way of example and not limitation, it will be evident that a die 100 requiring a package bottom 110 so as to effect substantially complete semi-hermetic sealing of die 100 within the confines of a package may have such package formed thereabout in several ways, depending on its configuration and how it is to be connected to higher-level packaging.

Figure 4:
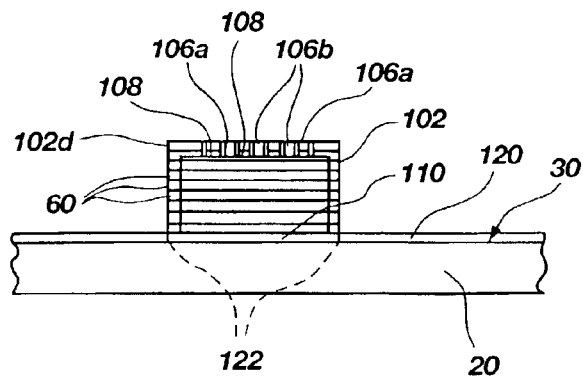
FIG. 4 is a schematic side elevation of one embodiment of a stereolithographic sequence of packaging a semiconductor die, including a package bottom, according to the present invention.

For example, as shown in FIG. 4, die 100 may be placed, active surface 104 up, on a sheet of material 120 on surface 30 of platform 20 with which material 16 is compatible and to which material 16 bonds when at least partially cured. In practice, a plurality of dice 100 would be placed on sheet 120. Laser 22 would then be activated and laser beam 26 scanned to build package sidewalls 102 layer by layer, bonding the lowest sidewall layer 60 to the material of sheet 120 under die 100 and defining package bottom 110 so that die 100 is substantially encapsulated after sidewalls 102 and top 106 are completed. Die 100 with material 120 adhered to the bottom thereof may then be severed from the sheet immediately as shown in broken lines 122, or carried thereon with a plurality of dice 100 for further handling, fabrication or testing operations.

Figure 5:
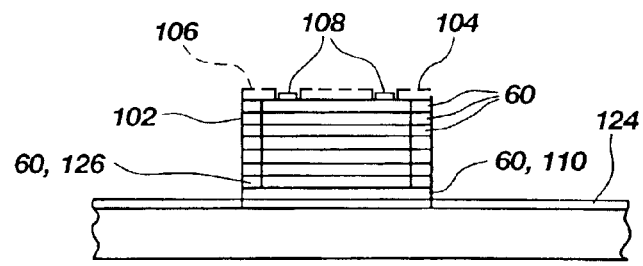
FIG. 5 is a schematic side elevation of another embodiment of a stereolithographic sequence of packaging a semiconductor die, including a package bottom, according to the present invention.

An alternative approach, shown in FIG. 5, which may be more economical from a material wastage standpoint, depending upon the cost of material 120, is to literally "build" package bottom 110 in one or more layers 60 on surface 30 of platform 20 or on a precisely-dimensioned (in terms of thickness) carrier sheet 124 from which material 16 may be subsequently released after cure through use of a release layer or coating, solvent, or other techniques known in the art. The package bottom 10 may include a peripheral lip or rim 126 comprising one or more layers 60 to form a receptacle into which die 100 is inserted, the package then being completed as described above with respect to FIG. 4.

Figure 6A:
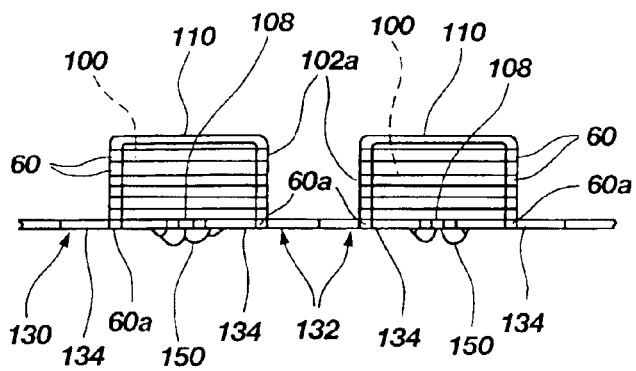
FIGS. 6A and 6B are schematic side elevations of yet another embodiment of a stereolithographic sequence of packaging a die, including a package bottom, according to the present invention.
Figure 6B:
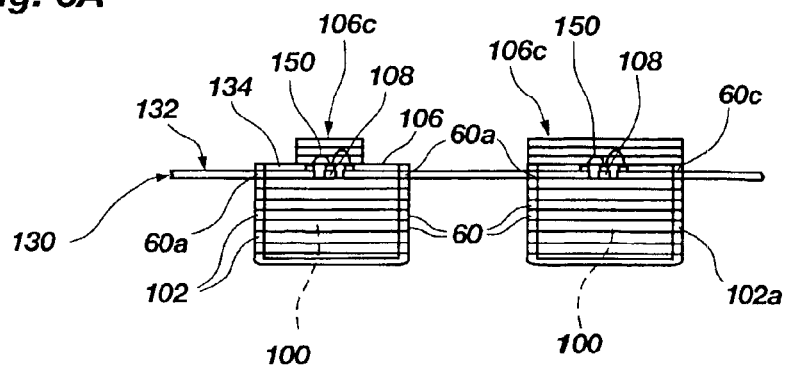

Yet another approach, shown in FIGS. 6A and 6B, which may be suitable for lead frame-mounted dice 100, involves the use of a lead frame strip 130 carrying a plurality of dice 100 secured and electrically connected (as by wire bonding, thermocompression bonding, TAB or otherwise as known in the art) to lead frames 132 of the strip 130. In this instance (see FIG. 6A), the dice 100 are first presented for packaging face down, the lead frame strip 130 carrying dice 100 partially submerged, and material 16 is at least partially cured, layer 60 by layer 60, from a level where lead fingers 134 are located to first fix a discontinuous layer 60a of material intermediate the lead fingers 134 and around the lead finger-devoid periphery of the dice 100 at that level, and then to build the lower portion package sidewalls 102a and package bottom 110 layer 60 by layer 60. The lead frame strip 130 is then inverted (see FIG. 6B) and the upper portion package sidewalls 102b (if any, such as might be required for a package housing a paddle-type lead frame wherein the lead fingers 134 may extend laterally below the upper, active surface of the die or if a dam is built about the active surface of the die as dam 102*d* in FIG. 4) is built layer 60 by layer 60, after which the package top 106 is formed. Again, it should be noted that adequate dielectric coverage of unusually large or high projecting surface features of a given die 100 such as wire bonds 150 with a package top or top portion 106*c* of enhanced thickness may be ensured through the use of one or more additional cameras 74, 76, 78. Thus, unlike a conventional, transfer molding packaging process, the stereolithographic process of the present invention is adaptable to ensure adequate encapsulation of semiconductor die assemblies with dimensions outside a conventional tolerance range. Further, it is also contemplated that the upper portion sidewalls 102*b*, if any, may first be formed, then the package top 106, the die 100 then being inverted for formation of the lower portion sidewalls 102*a* and the package bottom 110, the exact sequence being immaterial to the practice of the invention.

It is also notable that the method depicted and described with respect to FIGS. 6A and 6B has utility with a variety of lead frame configurations, including conventional lead frames having a die mounting paddle, or paddle-less leads-over-chip (LOC) lead frames or leads-under-chip (LUC) lead frames. The present invention is adaptable to various arrangements of lead fingers, whether extending from a single side of a package as in a zig-zag in-line package (ZIP), single in-line package (SIP) arrangements, from both sides as in a dual in-line package (DIP) arrangement or a more modern thin small outline package (TSOP), from four sides as in a quad flat pack (QFP) arrangement, a direct die connect package (DDC), or otherwise.

Figure 7:
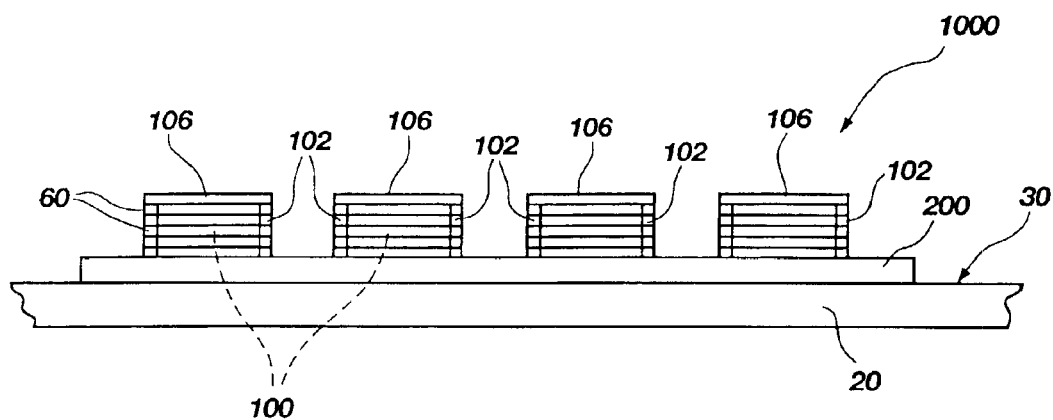
FIG. 7 is a schematic side elevation of a multi-chip module packaged according to the present invention.

Referring now to FIG. 7 of the drawings, it will be understood and appreciated that a plurality of dice 100 secured and electrically connected to a carrier substrate 200 to create a multi-chip module 1000, such as, without limitation, a single in-line memory module (SIMM), dual in-line memory module (DIMM) or triple in-line memory module (TRIMM), may be encapsulated in place on the carrier substrate in the same manner as described above with respect to individual dice 100. Specifically, sidewalls 102 comprising multiple layers 60 may be built up around the lateral peripheries of dice 100, and package tops 106 formed thereafter. If wire bonds, TAB bonds or other upwardly-projecting conductive connectors are employed to connect dice 100 to traces on carrier substrate 200, such structures may be detected by camera 70 (and 74, 76 or 78, if employed) so that the wire bonds may be individually covered with material 16 only to a required depth. Thus, in contrast to the use of excessive material in a conventional "glob top" of silicone gel, each die 100 may be encapsulated using a minimal volume of material 16.

Figure 8:
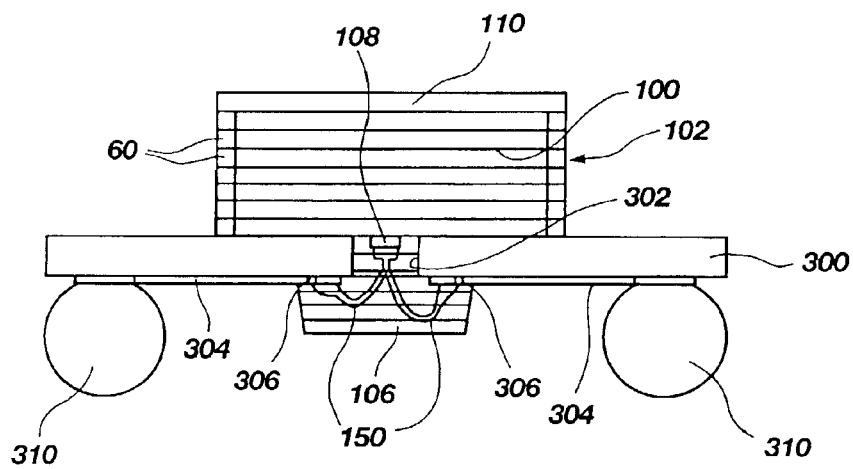
FIG. 8 is a schematic side elevation of a semiconductor die mounted to a carrier substrate in a board-on-chip configuration and packaged according to the present invention.

In yet another, board-on-chip (BOC) embodiment of the present invention shown in FIG. 8, a single die 100 or multiple dice 100 may be mounted active-surface facing a carrier substrate 300 having a slot or slots 302 therethrough (the number corresponding to the number of dice 100 to be carried thereon). In such a configuration, a single or double row of bond pads 108 running down the center of a die 100 is wire bonded as at 150 to ends 306 of circuit traces 304 adjacent slot 302 and on the opposite side of carrier substrate 300 from that to which die 100 is secured. Such an arrangement may be employed to use dice 100 configured for an LOC lead frame in a multi-chip module or to convert such dice to provide solder bumps or other conductive connective elements 310 (conductive epoxy, conductor-filled epoxy, anisotropically-conductive adhesive elements, etc.) projecting in an array for connection in a flip-chip configuration to higher level packaging. As shown in FIG. 8, the sides and back of a die 100 may be packaged with layered sidewalls 102 (again, which may comprise only a single, relatively thick layer 60) and a bottom 110 and (after inversion of carrier substrate 300) the wire bonds 150 projecting through slot 302 and extending from bond pads 108 to trace ends 306 covered with one or more layers 60 of at least partially cured material 16 comprising package top 106. Desirably, the entire slot may be filled and the wire bonds 150 covered to beyond the laterally outer peripheries of trace ends 306 so that the wires and bond points to trace ends 306 are covered.

Figure 12:
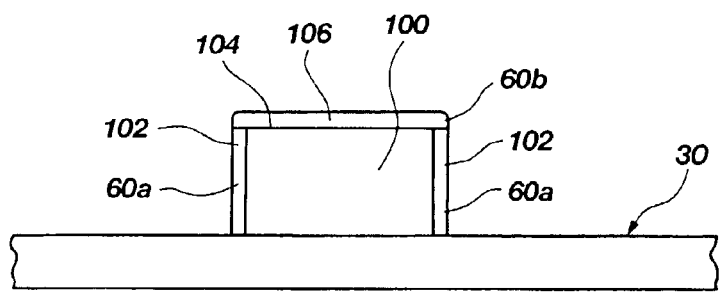
FIG. 12 is a side, partial sectional elevation of another embodiment of a semiconductor die packaged according to the present invention.
Figure 9:
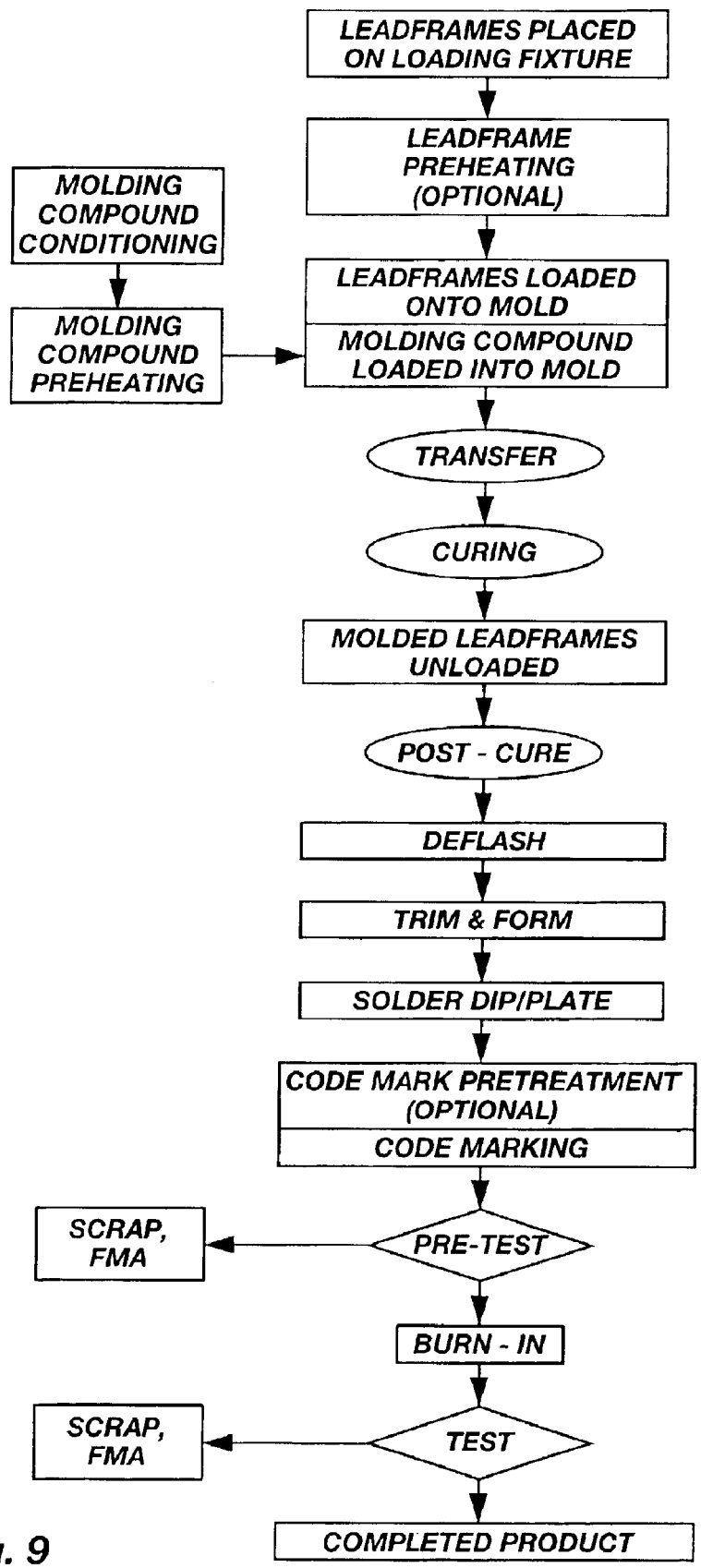
FIG. 9 is a flow chart of an exemplary process sequence for a conventional transfer molding operation employed for packaging lead fame-mounted semiconductor dice.
Figure 10A:
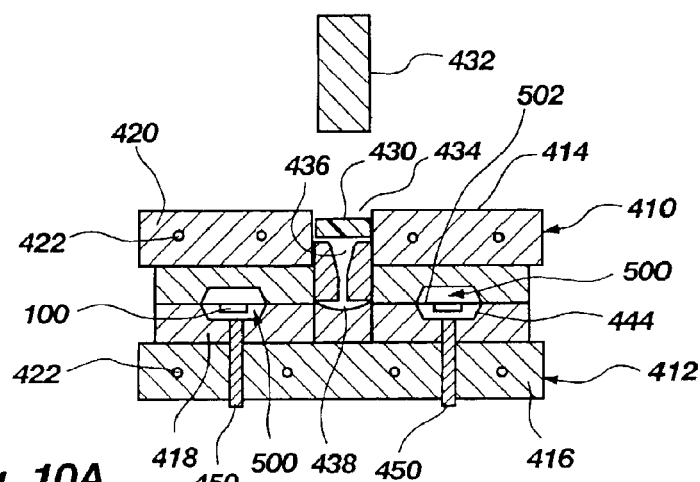
FIGS. 10A and 10B are side schematic elevations of a conventional transfer molding apparatus, showing pre-molding and post-molding encapsulant positions.
Figure 10B:
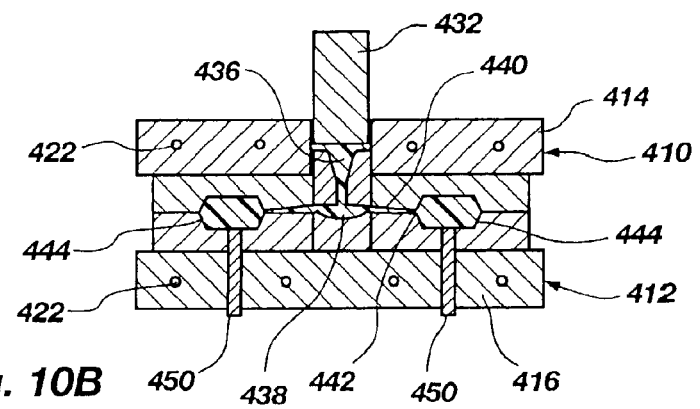
Figure 11:
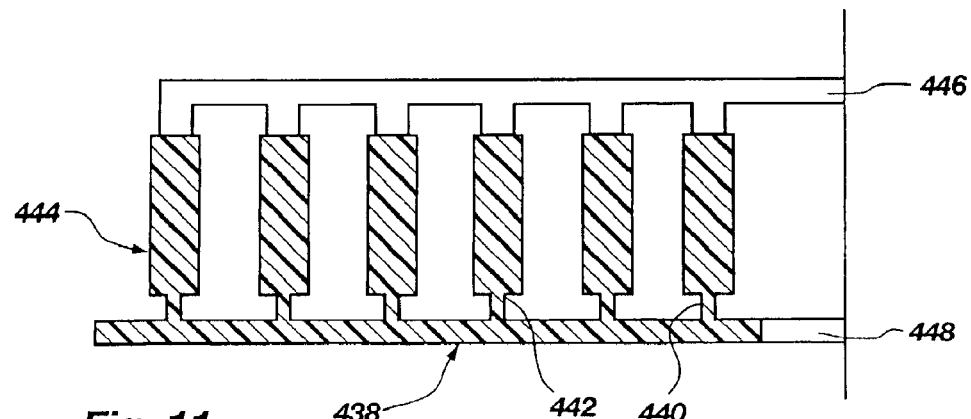
FIG. 11 is a top schematic elevation of one side of a transfer mold of FIGS. 10A and 10B, depicting encapsulant flow and venting of the primary mold runner and the mold cavities wherein die assemblies are contained for encapsulation.

Referring now to FIG. 12 of the drawings, an extremely simple and effective packaging approach according to the invention is illustrated. Semiconductor die 100, residing on surface 30 (or alternatively on a release layer or on a package bottom as discussed above) is packaged using only two layers 60 of material 16. The first layer 60*a* forms the entire height of the sidewalls 102, while the second layer 60*b* forms the entire package top 106 extending over the tops of sidewalls 102. Of course, layer 60*a* may be formed high enough so as to extend over active surface 104 of semiconductor die 100 to define a dam thereabout to contain liquid material 16, the upper surface of which may be skin-cured and the underlying material 16 subsequently completely cured by a broad-source UV radiation or by heat cure. Thus, it is possible to effect the complete packaging of a semiconductor die or other electronic component using no more than three layers 60 of material 16 or, if no package bottom is required (such as in a multi-chip module), only two layers 60.

It is notable that the method of the present invention, in addition to eliminating the capital equipment expense of transfer molding processes, is extremely frugal in its use of dielectric encapsulant material 16, since all such material in which cure is not initiated by laser beam 26 remains in a liquid state in reservoir 14 for use in packaging the next plurality of dice 100 or modules 1000. Further, since it is no longer necessary to encapsulate dice with packaging of sufficient wall thickness to accommodate relatively large dimensional variations such as those which may be exhibited by wire bond loop heights, the overall volume of packaging material may be smaller in some cases. Also, surprisingly, the package dimensional tolerances achievable through use of the present invention are more precise, e.g., three times more precise, than those of which a transfer molding system is capable, and there is no need for an inclined mold sidewall (and thus extra packaging material) to provide a release angle to facilitate removal of a packaged die from a mold cavity. Moreover, there is no potential for mold damage, mold wear, or requirement for mold refurbishment. Finally, the extended cure times at elevated temperatures, on the order of, for example, four hours at 175° C., required after removal of batches of dice from the transfer mold cavities are eliminated. Post-cure of die packages formed according to the present invention may be effected with broad-source UV radiation emanating from, for example, flood lights in a chamber through which dice are moved on a conveyor, or in large batches. Additionally, if some portion of a package is shadowed by a portion of a die or lead frame, cure of material 16 in that area may be completed in an oven at a relatively low temperature such as, for example,160° C.

It should also be noted that the packaging method of the present invention is conducted at substantially ambient temperature, the small beam spot size and rapid traverse of laser beam 28 around and over the semiconductor dice 100 resulting in negligible thermal stress thereon. Physical stress on the semiconductor dice and associated lead frames and bond wires is also significantly reduced, in that material 16 is fixed in place and not moved over the dice in a viscous, high-pressure wave front as in transfer molding, followed by cooling-induced stressing of the package. Bond wire sweep is eliminated, as is any tendency to drive particulates in the polymer encapsulant between lead fingers and an underlying portion of the active surface of the die with consequent damage to the integrity of the active surface.

It should be specifically noted that packaging electronic components in accordance with the invention may be effected with the use of a liquid material, such as the aforementioned polymers, which is "filled" with particulates of silicon or other materials. By such an approach, the cost of the liquid material may be lowered in appropriate instances where the filler does not adversely alter the coefficient of thermal expansion (CTE) of the packaging material. Further, the CTE of the packaging material may be tailored to be similar to, or even closely match in some instances, the CTE of the substrate onto, or adjacent, which the packaging material is applied by appropriate selection of the volume and type of filler material. Thus, whether the substrate to which the packaging material is applied comprises a plastic, a ceramic, or silicon (or other material), the packaging filler mixture may be adjusted as desired or required.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of fabrication of articles, comprising:
   placing a plurality of workpieces at a common horizontal plane;
   recognizing a location and orientation of each workpiece of the plurality; and
   using the recognized location and orientation of each workpiece of the plurality, stereolithographically forming a structure comprising a plurality of layers of at least semisolid material by selectively curing portions of a curable liquid material at locations abutting each of the plurality of workpieces.

2. The method of claim 1, further comprising storing data including at least one physical parameter of the workpieces in computer memory, and using the stored data in conjunction with a machine vision system to recognize the location and orientation of the workpieces.

3. The method of claim 2, further comprising using the stored data, in conjunction with the machine vision system, to selectively form at least one layer of the plurality of layers of the at least semisolid material stereolithographically over at least one portion of an upper surface of each of the workpieces of the plurality.

4. The method of claim 1, further comprising using the stored data, in conjunction with the machine vision system, to form sidewalls comprising at least one layer of the at least semisolid material about each of the workpieces of the plurality.

5. The method of claim 1, wherein the workpieces of the plurality comprise semiconductor dice, and further including securing the plurality of semiconductor dice to lead frames of a lead frame strip prior to placing the plurality of semiconductor dice at the common horizontal plane.

6. The method of claim 1, wherein the workpieces of the plurality comprise semiconductor dice, and further including securing each semiconductor die of the plurality to a carrier substrate prior to placing the plurality of semiconductor dice at the common horizontal plane.

7. The method of claim 1, further comprising, after stereolithographically forming the structure comprising a plurality of layers of at least semisolid material:
   inverting the plurality of workpieces and placing the plurality of workpieces at a common horizontal plane;
   recognizing a location and orientation of each inverted workpiece of the plurality; and
   stereolithographically forming another structure comprising at least one layer of at least semisolid material abutting each of the plurality of workpieces.

8. The method of claim 7, further comprising storing data including at least one physical parameter of the workpieces in computer memory, and using the stored data in conjunction with a machine vision system to recognize the location and orientation of the workpieces.

9. The method of claim 8, further comprising using the stored data, in conjunction with the machine vision system, to selectively form the at least one layer of semisolid material stereolithographically of the another structure on at least one portion of an upper surface of each of the workpieces of the plurality.

10. The method of claim 8, further comprising using the stored data, in conjunction with the machine vision system, to sequentially form sidewalls comprising a plurality of superimposed, contiguous, mutually adhered layers of the at least semisolid material about each of the workpieces of the plurality.

11. The method of claim 7, wherein the plurality of workpieces comprises semiconductor dice, and further including securing the plurality of semiconductor dice to lead frames of a lead frame strip prior to placing the plurality of semiconductor dice at the common horizontal plane.

12. The method of claim 7, wherein the plurality of workpieces comprises semiconductor dice, and further including securing each semiconductor die of the plurality to a carrier substrate prior to placing the plurality of semiconductor dice at the common horizontal plane.

13. An apparatus for fabrication of articles, comprising:
   a stereolithographic system structured for selective transformation of portions of material in a flowable state to at least a semisolid state in;
   a machine vision system in operable communication with the stereolithographic system including at least one camera oriented for detecting objects within the vision field;
   a computer in operable communication with both the stereolithographic system and the machine vision system, the computer being programmed to respond to input from the machine vision system indicative of a presence, location and orientation of at least one workpiece in the vision field and to initiate and control the stereolithographic system to selectively transform portions of material in a flowable state to at least a semisolid state at locations abutting the at least one workpiece to form at least one structure comprising a plurality of layers of at least semisolid material abutting the at least one workpiece.

14. The apparatus of claim 13, further including memory in operable communication with the computer, wherein the memory includes at least one data file representative of at least one physical parameter of the at least one workpiece, and the computer is programmed to employ the at least one data file at least in part to determine the presence, location and orientation of the at least one workpiece in the vision field.

15. The apparatus of claim 14, wherein the computer is programmed to employ the at least one data file at least in part to select a location and configuration of the at least one structure formed abutting the at least one workpiece.

16. The apparatus of claim 15, wherein the computer is programmed to employ the at least one data file at least in part to detect a presence of a physically defective workpiece in the vision field.

17. The apparatus of claim 16, wherein the at least one workpiece comprises a plurality of workpieces disposed at a common horizontal plane.

18. The apparatus of claim 17, wherein the plurality of workpieces each have at least one differing physical parameter, and the at least one data file comprises a plurality of data files, each data file of the plurality representative of the at least one differing physical parameter, and the computer is programmed to employ the plurality of data files at least in part to recognize the plurality of workpieces differing in at least one physical parameter as being different.

* * * * *